(12) United States Patent
Ma et al.

(10) Patent No.: US 11,696,416 B2
(45) Date of Patent: Jul. 4, 2023

(54) SYSTEM AND METHOD FOR FACILITATING MOVEMENT OF COMPONENTS IN A CHASSIS

(71) Applicant: Dell Products L.P., Hopkinton, MA (US)

(72) Inventors: Liang-Chun Ma, Taoyuan (TW); Matthew Bryan Gilbert, Austin, TX (US); Richard A. Crisp, Austin, TX (US); Kevin R. Garrett, Austin, TX (US)

(73) Assignee: DELL PRODUCTS L.P., Hopkinton, MA (US)

( * ) Notice: Subject to any disclaimer, the term of this patent is extended or adjusted under 35 U.S.C. 154(b) by 73 days.

(21) Appl. No.: 16/903,359

(22) Filed: Jun. 16, 2020

(65) Prior Publication Data
US 2021/0390985 A1  Dec. 16, 2021

(51) Int. Cl.
*H05K 7/14* (2006.01)
*G06F 1/18* (2006.01)

(52) U.S. Cl.
CPC .......... *H05K 7/1408* (2013.01); *G06F 1/185* (2013.01)

(58) Field of Classification Search
CPC .. H05K 7/1408; H05K 7/1409; H05K 7/1405; G06F 1/185; G06F 1/186; G06F 1/187; E05B 65/463; G11B 33/128; G11B 33/124
See application file for complete search history.

(56) References Cited

U.S. PATENT DOCUMENTS

| 7,477,511 B2 * | 1/2009 | Hsu | G11B 33/12 |
| | | | 361/679.37 |
| 2007/0064385 A1 * | 3/2007 | Paul | G06F 1/187 |
| | | | 361/679.4 |

* cited by examiner

*Primary Examiner* — James Wu
(74) *Attorney, Agent, or Firm* — Chamberlain, Hrdlicka, White, Williams, & Aughtry

(57) ABSTRACT

A chassis for housing a computing device of an information handling system includes a receiving portion of an expansion card receiver that receives an expansion card and operably connects the expansion card to another component of the computing device while the expansion card is received by the receiving portion. The chassis further includes a management portion of the expansion card receiver that receives a force from a user and, in response to receiving the force: transitions the management portion from a first state to a second state. In the first state, a handle, that enables the expansion card to be removed from the chassis is disposed inside of the management portion and the expansion card receiver is locked to the chassis. In the second state, the handle is disposed outside of the management portion and the expansion card receiver is unlocked from the chassis.

10 Claims, 14 Drawing Sheets

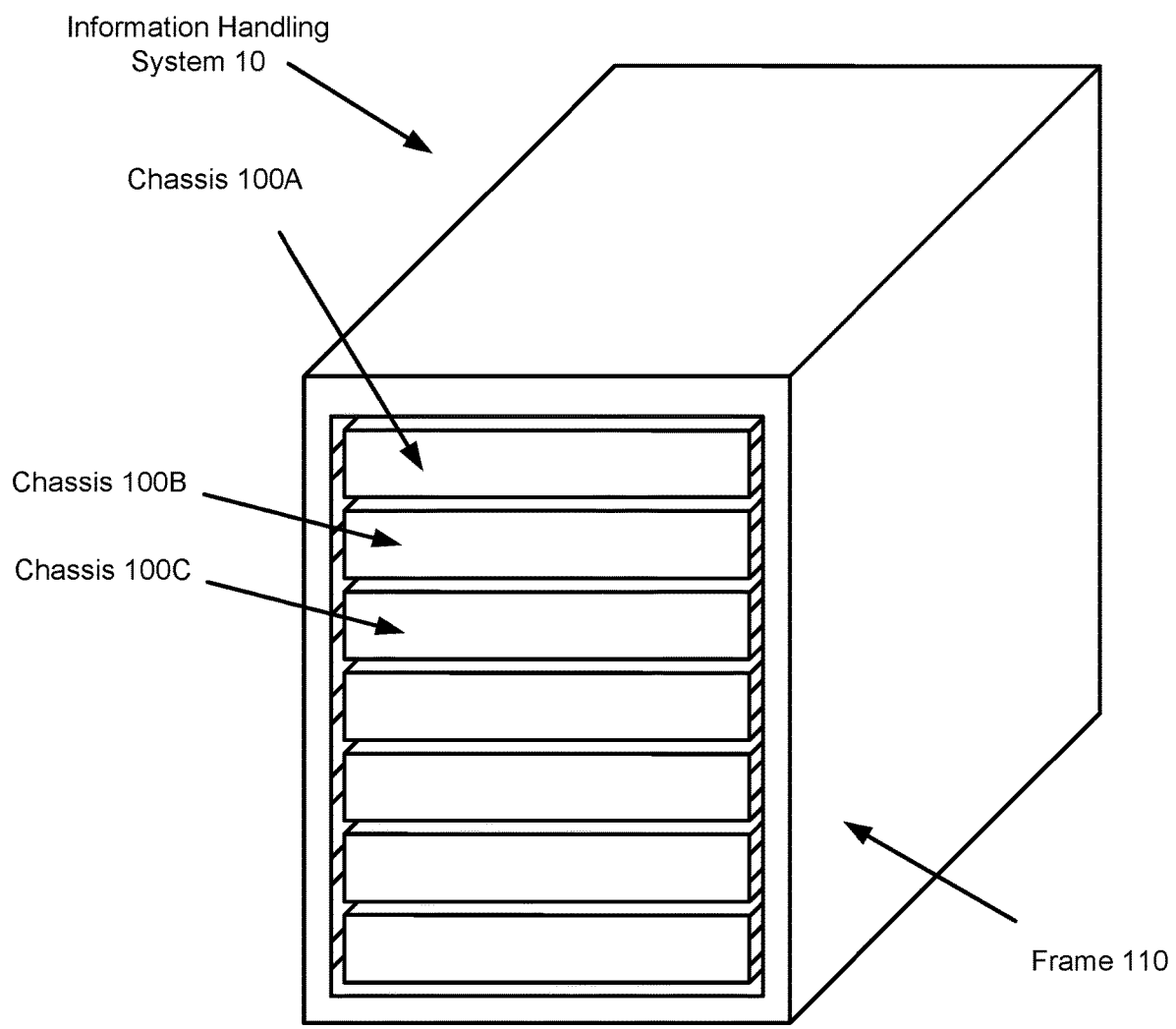
FIG. 1.1

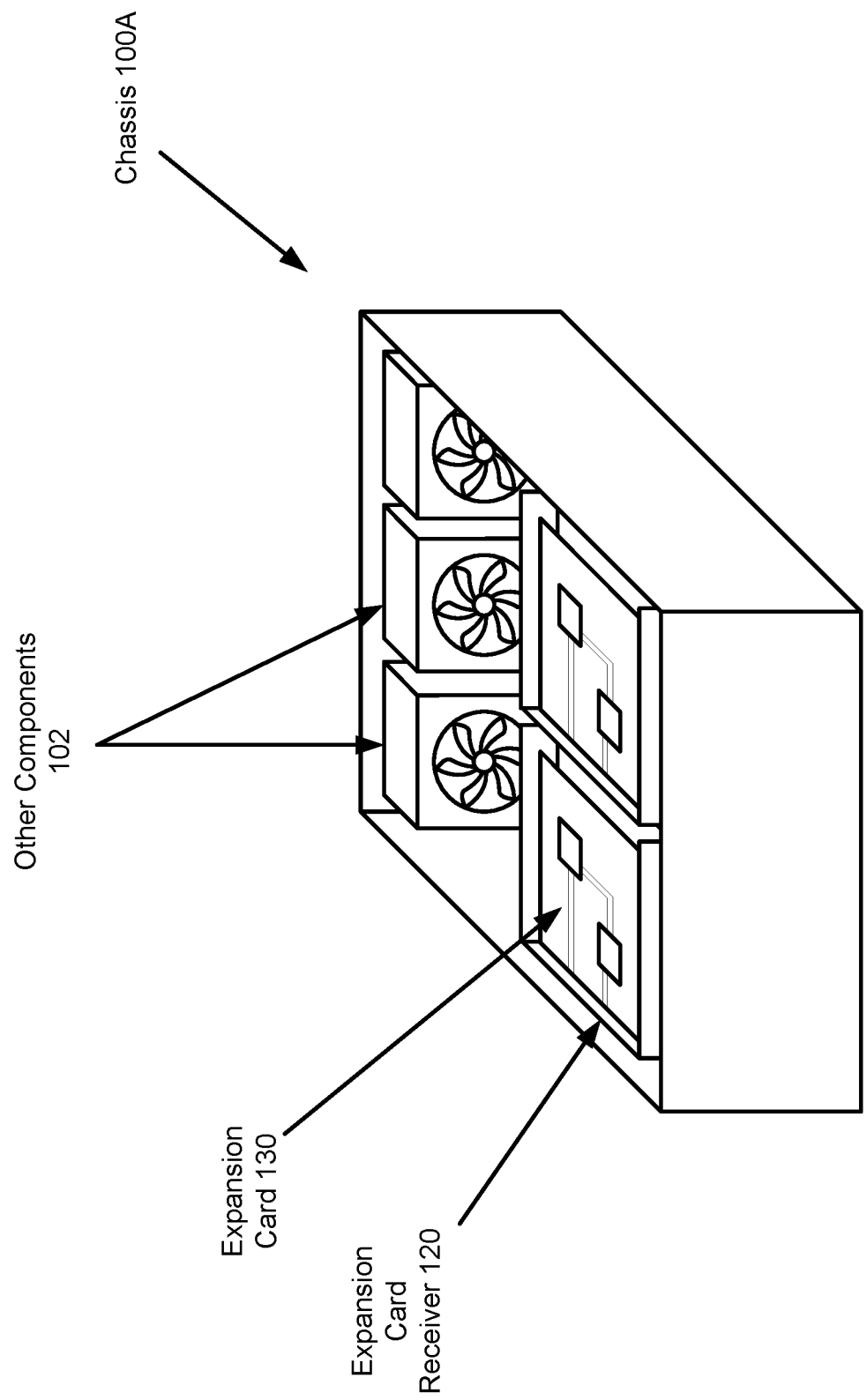
FIG. 1.2

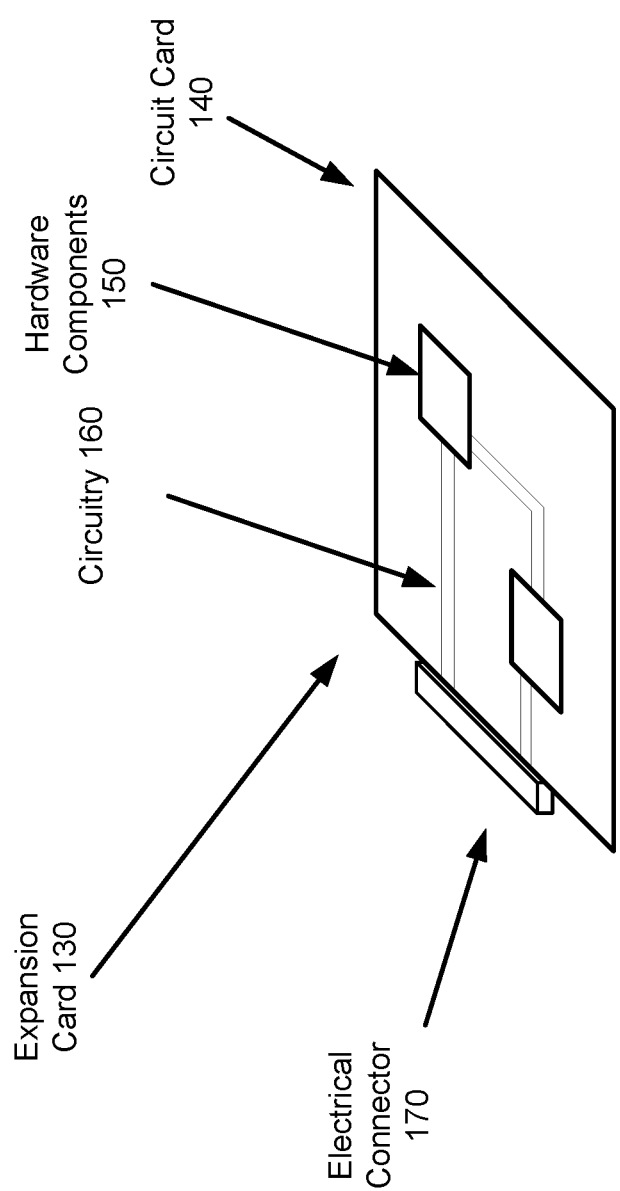
FIG. 1.3

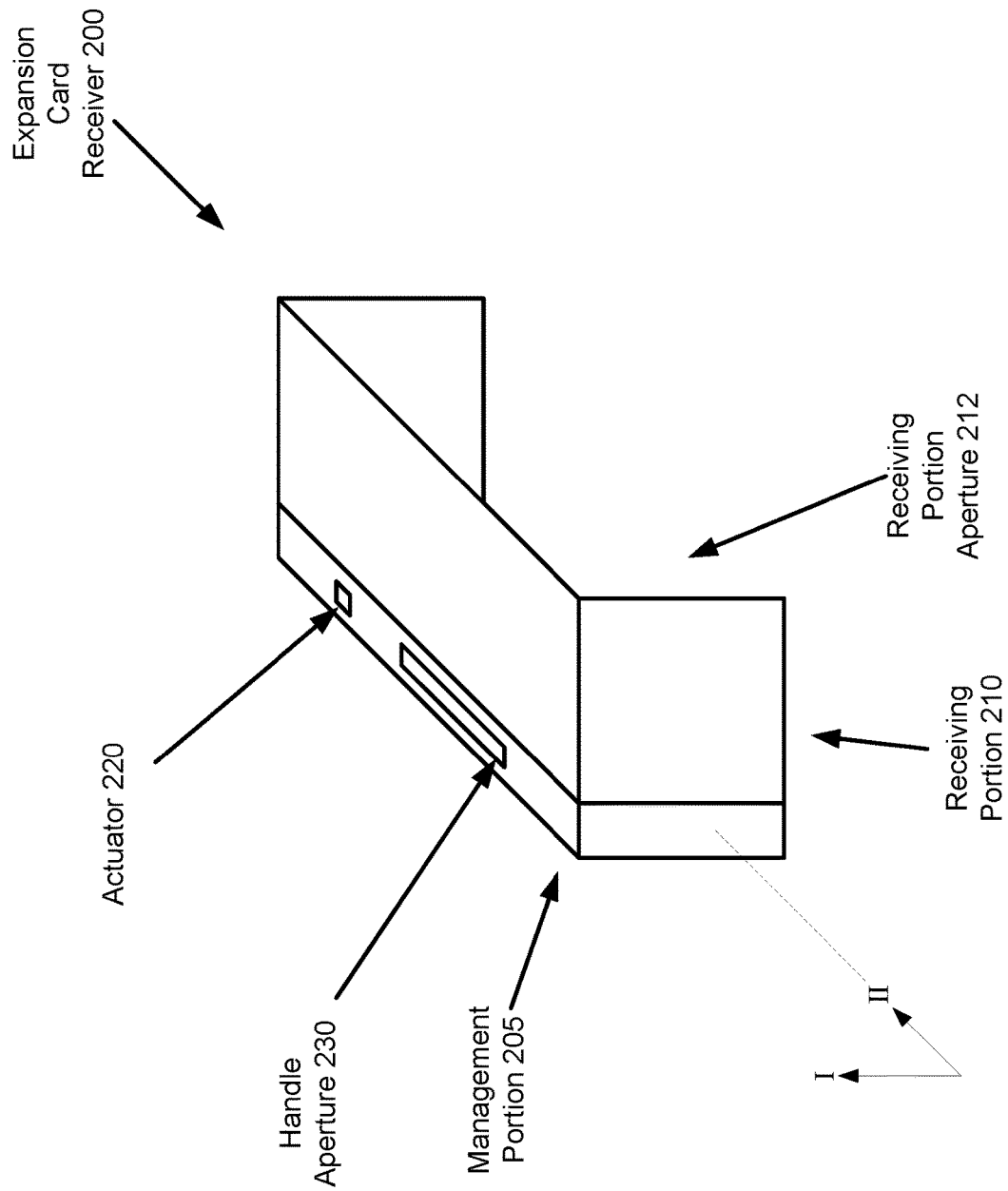
FIG. 2.1

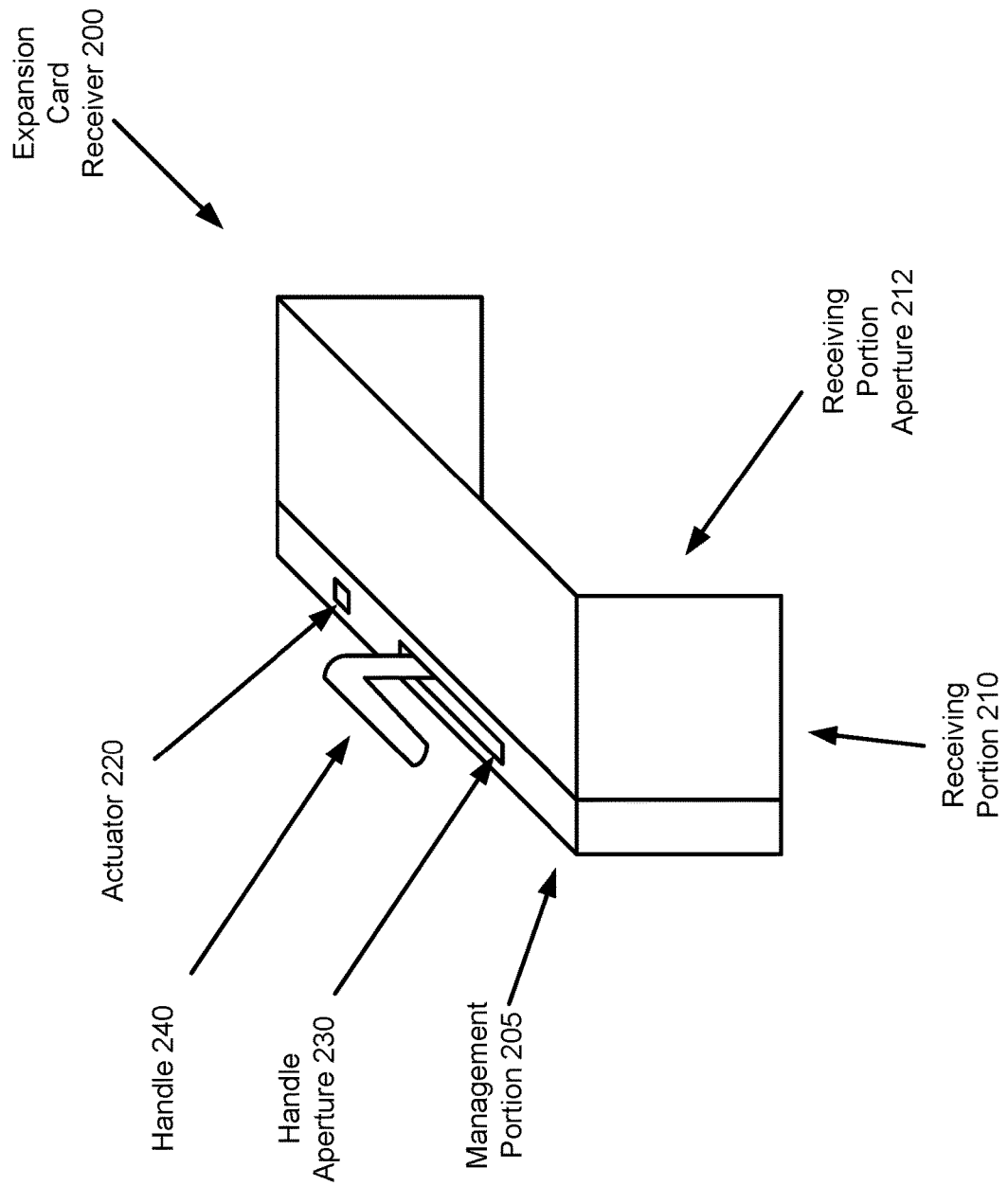
FIG. 2.2

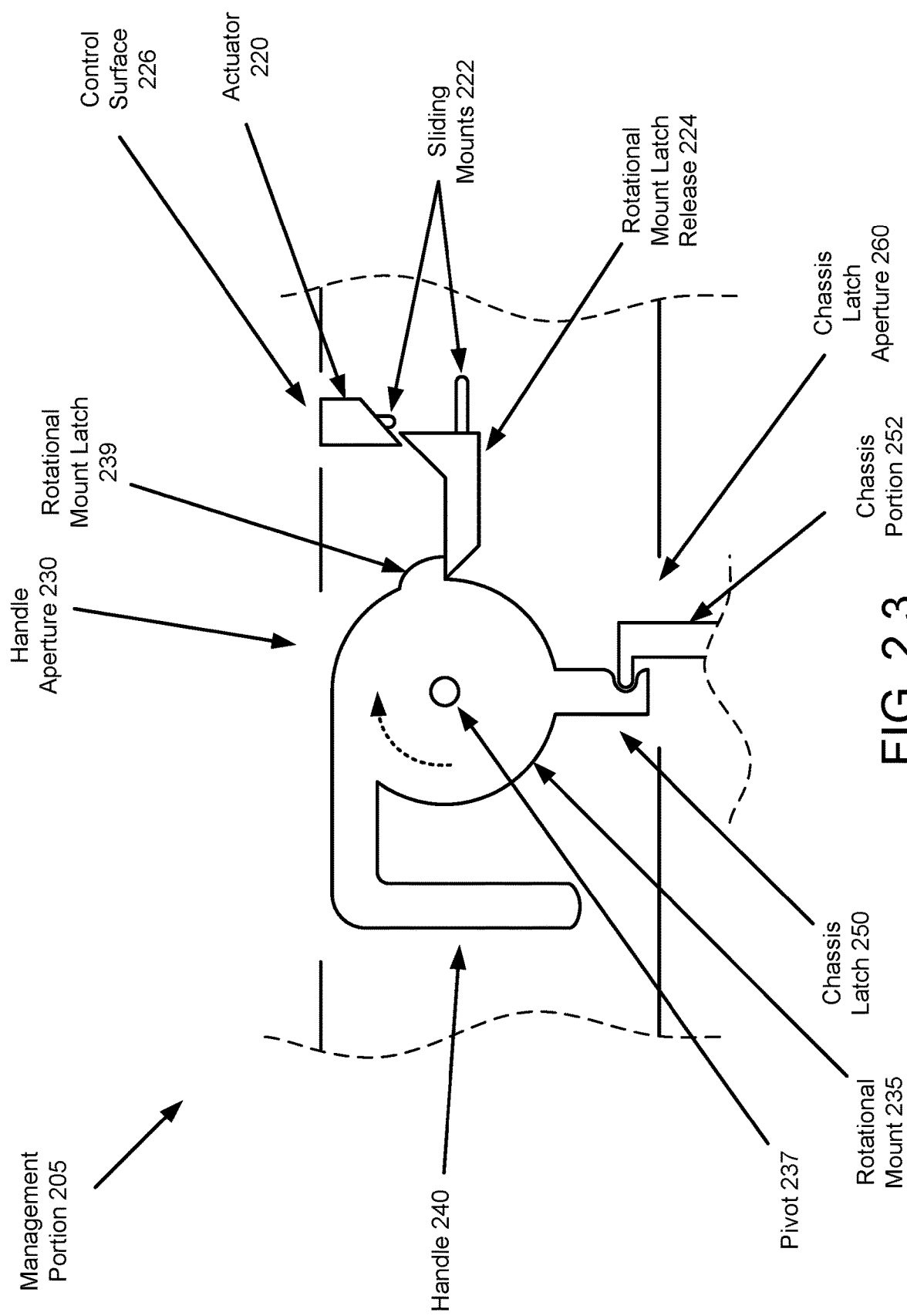
FIG. 2.3

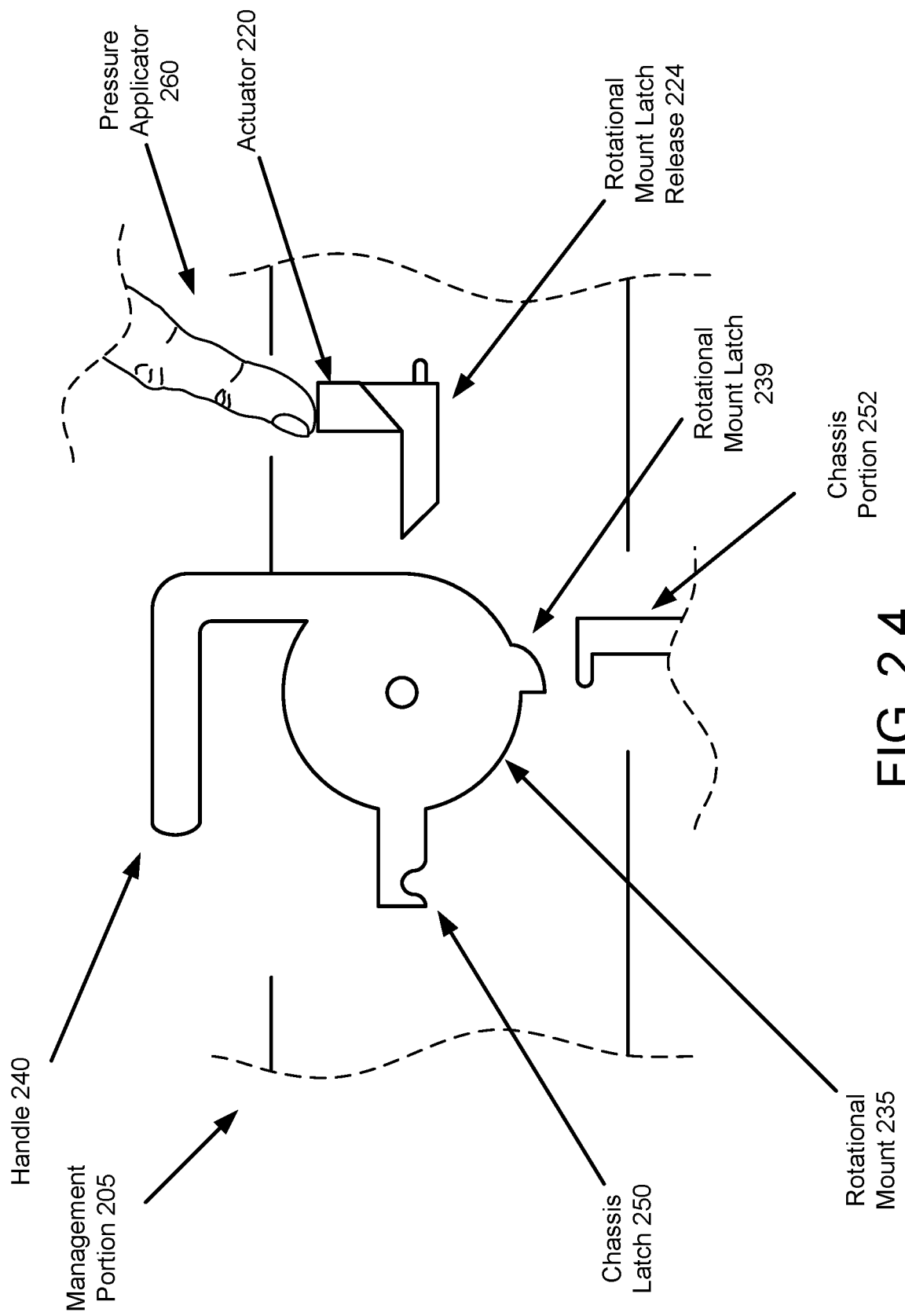
FIG. 2.4

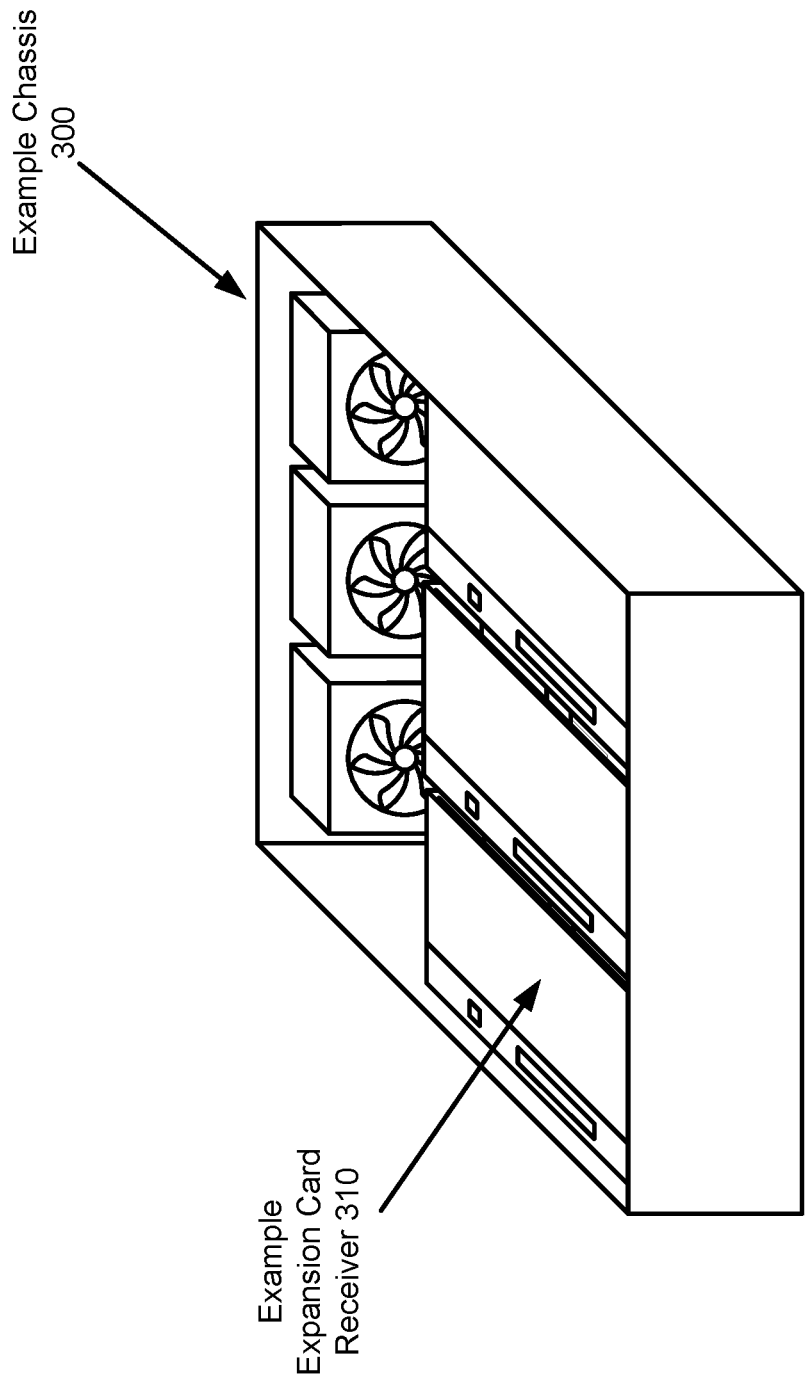
FIG. 3.1

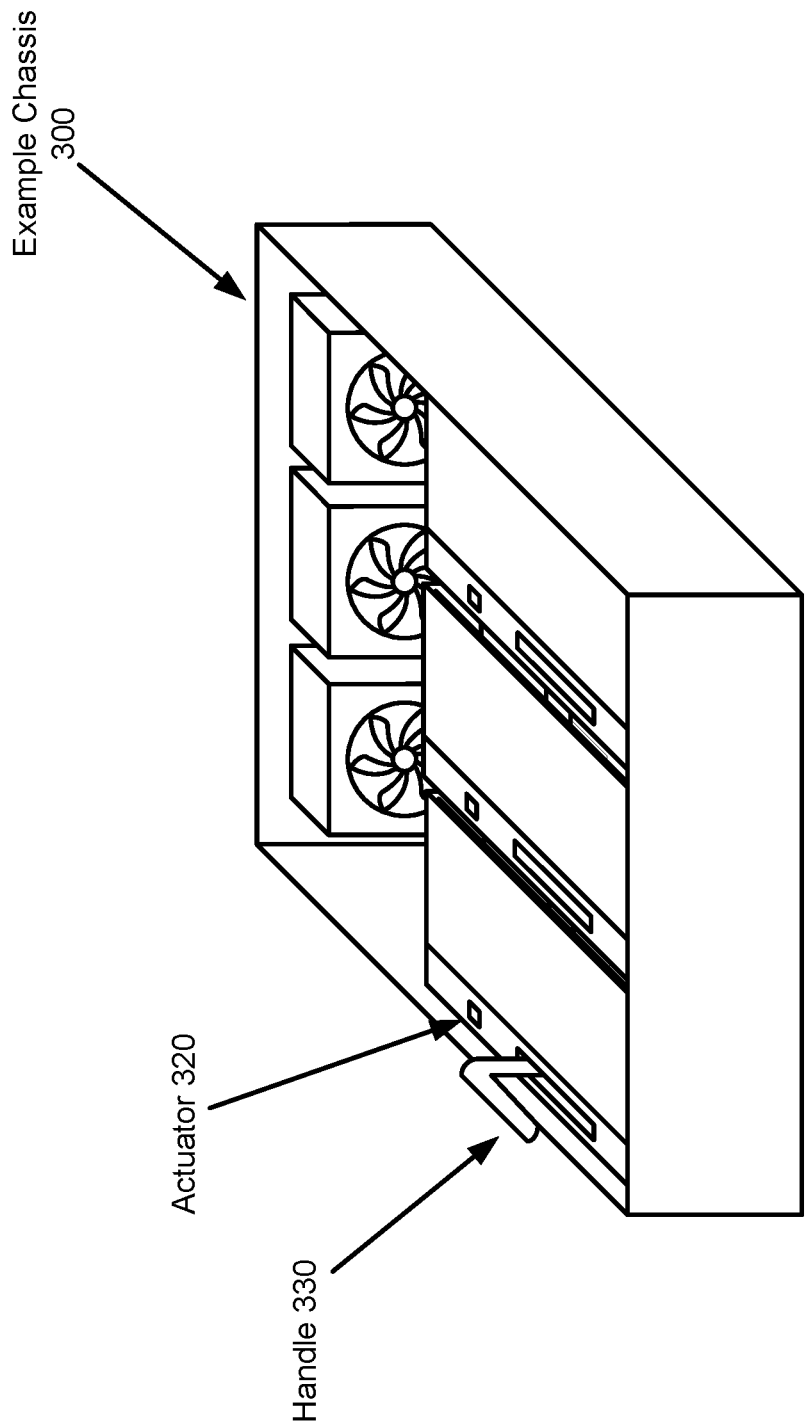
FIG. 3.2

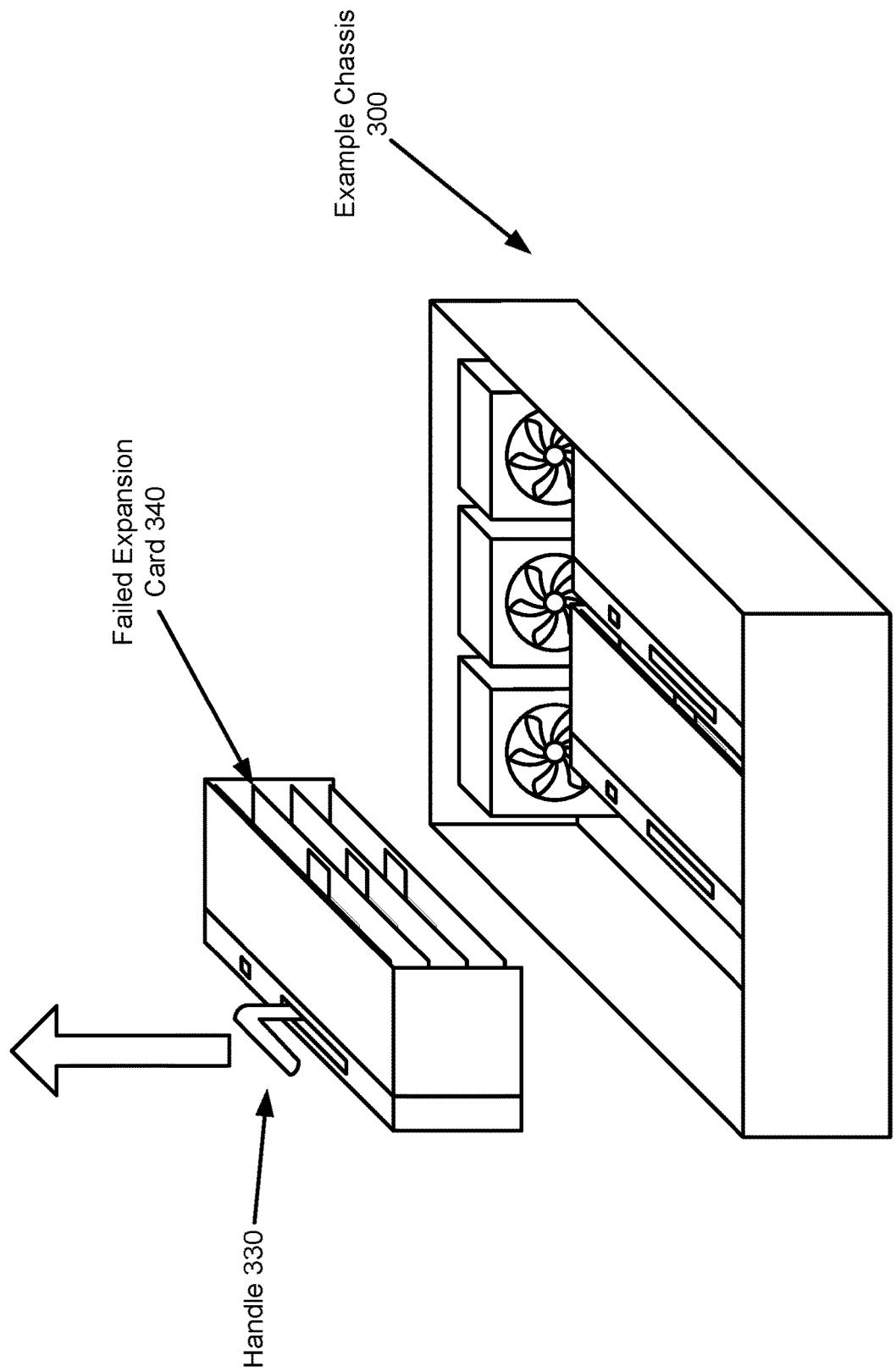
FIG. 3.3

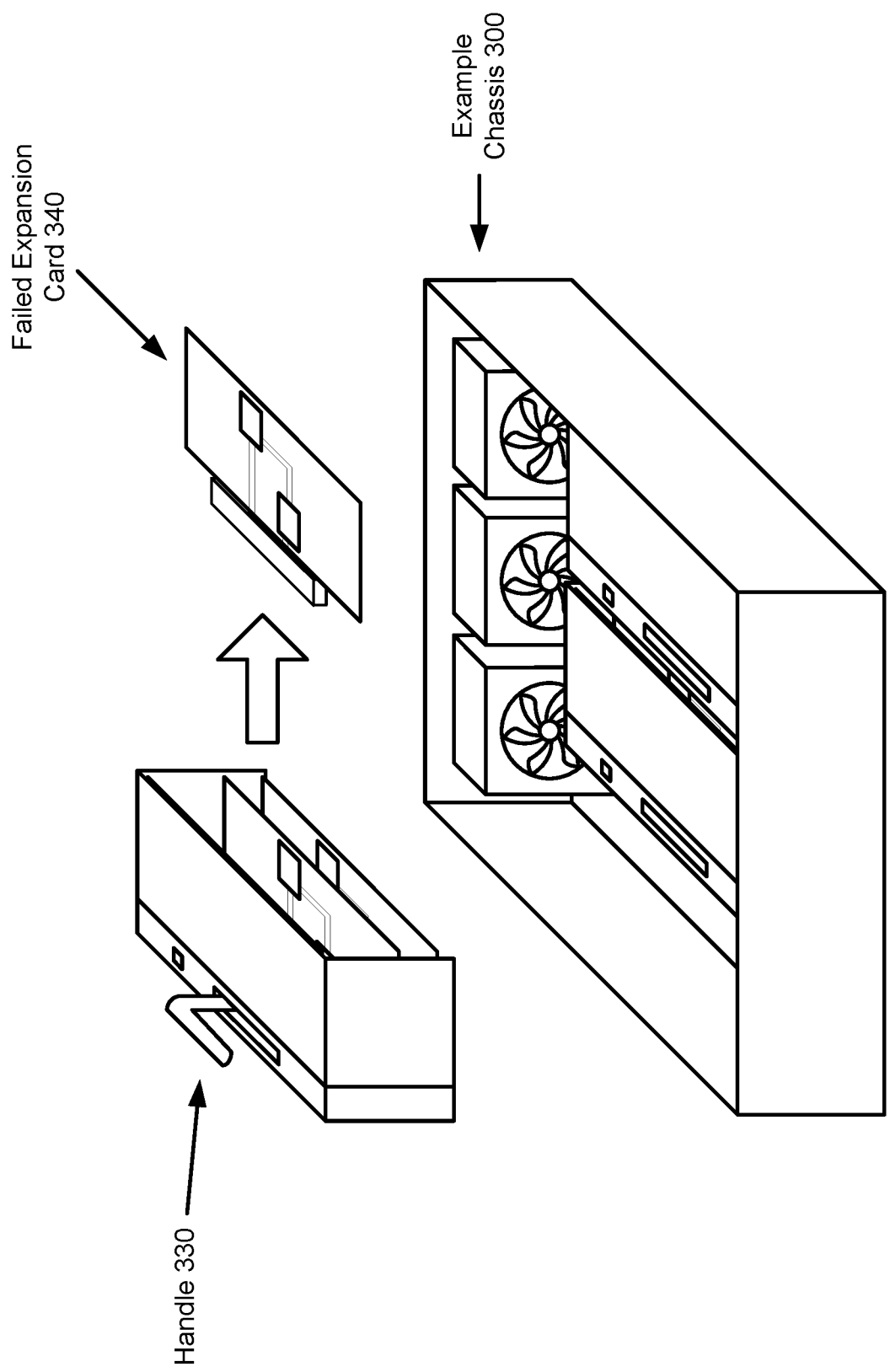
FIG. 3.4

SYSTEM AND METHOD FOR FACILITATING MOVEMENT OF COMPONENTS IN A CHASSIS

BACKGROUND

As the value and use of information continues to increase, individuals and businesses seek additional ways to process and store information. One option available to users is information handling systems. An information handling system (IHS) generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Use cases for information handling systems are causing progressively larger number of information handling systems to be disposed near each other. For example, rack mount systems utilize a rack structure to stack many information handling systems in a vertical arrangement. Due to the changing uses of information handling systems, chassis of information handling systems may modular. That is, a chassis may be composed of multiple enclosures that may be attached to each other to form the chassis of the information handling systems. When the multiple enclosures are attached, components of the information handling system disposed in each of the enclosures may become operably connected to each other.

SUMMARY

In one aspect, a chassis for housing a computing device of an information handling system in accordance with one or more embodiments of the invention includes a receiving portion of an expansion card receiver that receives an expansion card and operably connects the expansion card to another component of the computing device while the expansion card is received by the receiving portion. The chassis further includes a management portion of the expansion card receiver that receives a force from a user; in response to receiving the force: transitions the management portion from a first state to a second state, in the first state: a handle, that enables the expansion card to be removed from the chassis, is disposed inside of the management portion, the expansion card receiver is locked to the chassis, and in the second state: the handle is disposed outside of the management portion in a position that enables a user to utilize the handle, the expansion card receiver is unlocked from the chassis.

In one aspect, an expansion card receiver in accordance with one or more embodiments of the invention includes a receiving portion that receives an expansion card and operably connects the expansion card to another component of a computing device while the expansion card is received by the receiving portion. The expansion card further includes a management portion that receives a force from a user; in response to receiving the force: transitions the management portion from a first state to a second state, in the first state: a handle, that enables the expansion card to be removed from a chassis of the computing device, is disposed inside of the management portion, the expansion card receiver is locked to the chassis, and in the second state: the handle is disposed outside of the management portion in a position that enables a user to utilize the handle, the expansion card receiver is unlocked from the chassis.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 1.1 shows a diagram of an information handling system in accordance with one or more embodiments of the invention.

FIG. 1.2 shows a diagram of a chassis in accordance with one or more embodiments of the invention.

FIG. 1.3 shows a diagram of an expansion card in accordance with one or more embodiments of the invention.

FIG. 2.1 shows a diagram of an expansion card receiver in a first state in accordance with one or more embodiments of the invention.

FIG. 2.2 shows a diagram of an expansion card receiver in a second state in accordance with one or more embodiments of the invention.

FIG. 2.3 shows a diagram of an internal mechanism of the expansion card receiver in the first state in accordance with one or more embodiments of the invention.

FIG. 2.4 shows a diagram of the internal mechanism of the expansion card receiver in the second state in accordance with one or more embodiments of the invention.

FIG. 3.1 shows a diagram of an expansion card receiver disposed in a chassis in the first state in accordance with one or more embodiments of the invention.

FIG. 3.2 shows a diagram of an expansion card receiver disposed in a chassis in the second state in accordance with one or more embodiments of the invention.

FIG. 3.3 shows a diagram of an expansion card receiver after removal from the chassis in accordance with one or more embodiments of the invention.

FIG. 3.4 shows a diagram of an expansion card receiver after an expansion card is removed in accordance with one or more embodiments of the invention.

DETAILED DESCRIPTION

Figure 4:
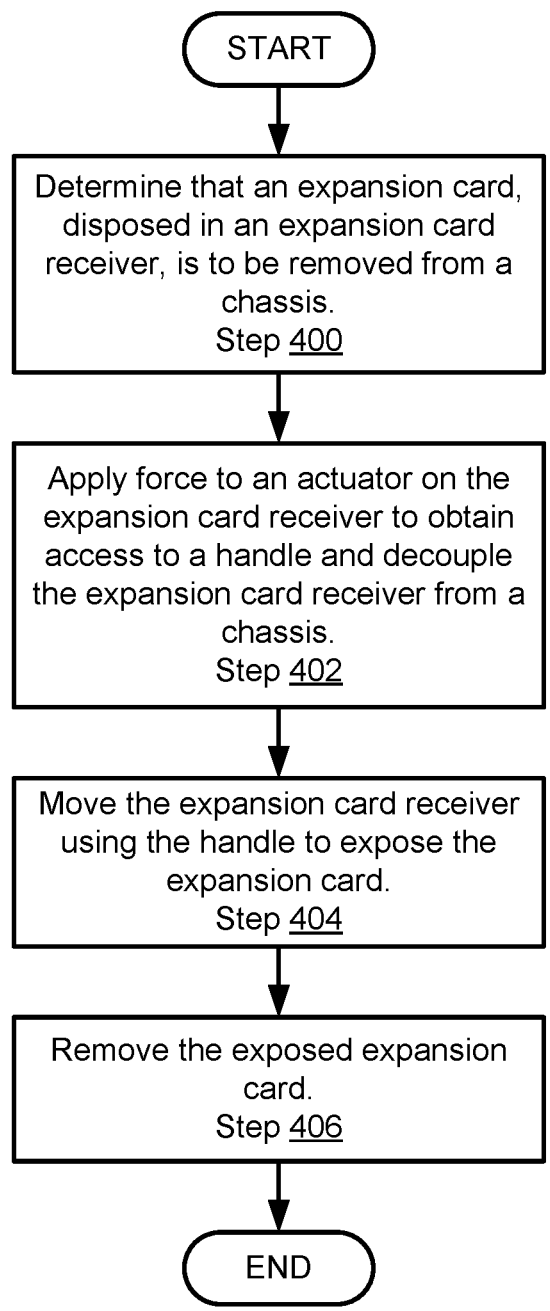
FIG. 4 shows a flowchart of a method of removing an expansion card receiver from a chassis in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing components of an information handling system. An information handling system may be a system that provides computer implemented services. These services may include, for example, database services, electronic communication services, data storage services, etc.

To provide these services, the information handling system may include one or more computing devices. The computing devices may include any number of hardware components that facilitate providing of the services of the information handling system.

Overtime, hardware components may need to be removed from and/or added to the system. For example, the hardware components may become damaged, outdated, need to be tested, or otherwise need to be temporarily and/or permanently removed.

However, removal of a hardware components may be challenging. As computing devices have increased in sophistication, the packing density of hardware components has increased resulting in the hardware components being less physically accessible. Lack of physical access may reduce the ability of persons to grasp, grip, or otherwise physically manipulate them making removal and/or insertion of such components more prone to damage to the components and/or other entities. Further, physical structures such as expansion card receivers have been developed to further increase the packing density of components within a chassis.

An expansion card receiver may be a device designed to manage (e.g., control the position, orientation, provide power to, remove thermal energy from, etc.) expansion cards. An expansion card (e.g., a graphics processing unit) may be a device that includes any number of hardware components usable for providing computer implemented services.

Embodiments of the invention may provide methods and devices for facilitating hardware component removal from and/or insertion into a system. Specifically, embodiments of the invention may provide an expansion card receiver that reversibly transitions between two states. In a first state, the expansion card receiver may be physically locked to another component (e.g., a chassis) and/or a handle usable to physically manipulate the expansion card receiver may be hidden within an internal volume of the expansion card receiver. By virtue of the handle being hidden within the expansion card receiver, the volume of the expansion card receiver may be reduced thereby enabling the expansion card to be tightly packed next to other components in a chassis.

In a second state, the expansion card receiver may be detached from the other component and the handle may be exposed (e.g., at least partially disposed outside of the expansion card receiver) to a person. For example, the handle may protrude outwardly from the expansion card receiver thereby enabling a person to easily grip and manipulate the physical location and/or orientation of the expansion card receiver using the handle.

To transition the expansion card receiver between states, the expansion card receiver may include an actuator disposed on a surface (e.g., top side) of the expansion card receiver that is unlikely to be obscured or otherwise rendered in accessible when the expansion card receiver is disposed in a chassis. The actuator may be operably connected to a mechanism that causes the expansion card to transition from the first state to the second state. The expansion card receiver may be transition from the second state to the first state using, for example, the handle by returning it within the internal volume of the expansion card receiver.

By doing so, an expansion card receiver in accordance with one or more embodiments of the invention may be place into and/or removed from a chassis even in regions in which other components are densely packed in a manner that is less likely to result in damage to the expansion card receiver, other components, and/or a person tasked with removing/placing the expansion card receiver.

FIG. 1.1 shows an information handling system (10) in accordance with one or more embodiments of the invention. The system may include a frame (110) and any number of chassis (e.g., 110A, 100B, 100C).

The frame (110) may be a mechanical structure that enables chassis to be positioned with respect to one another. For example, the frame (110) may be a rack mount enclosure storage system that enables chassis (e.g., rack mount chassis or other types of form factors) to be disposed within it. The frame (110) may be implemented as other types of structures adapted to house, position, orient, and/or otherwise physically, mechanically, electrically, and/or thermally manage chassis. By managing the chassis, the frame (110) may enable multiple chassis to be densely packed in space without negatively impacting the operation of the information handling system (10).

A chassis (e.g., 100A) may be a mechanical structure for housing components of an information handling system. For example, a chassis may be implemented as a rack mountable enclosure for housing components of an information handling system. The chassis may be adapted to be disposed within the frame (110) and/or utilize services provided by the frame (110) and/or other devices. The chassis may take on other form factors without departing from the invention.

While the information handling system (10) has been depicted in FIG. 1.1 as including multiple chassis, an information handling system in accordance with embodiments of the invention may include different numbers of chassis, be adapted to house chassis with different form factors, may include additional components, may include fewer components, and/or may include different components (e.g., other types of physical hardware such as network switches, routers, power supplies, cooling system, etc.).

Turning to FIG. 1.2, FIG. 1.2 shows a diagram of a chassis (100A) in accordance with one or more embodiments of the invention. A chassis may be a portion of an IHS and/or house all, or a portion, of an IHS. For example, a chassis may be a physical structure such as a rack mountable enclosure (or other standardized form factor compliant structure) that is adapted to house any number of components. The components of the chassis may be operably connected to other chassis and/or other devices via any combination of wired and/or wireless networks.

An information handling system may include a computing device (e.g., a collection of logical and/or physical devices for performing computations that may be used to provide computer implemented services) that provides any number of services. To provide services, the computing device may utilize computing resources provided by physical and/or logical components. The physical components may include, for example, processors, memory modules, storage devices, special purpose hardware, and/or other types of physical components that contribute to the operation of the computing device. Logical components may be, for example, virtual entities (e.g., virtual machines, virtualized computing resources, etc.) that utilize the physical components to provide their respective functionalities. For additional details regarding computing devices, refer to FIG. 6.

Because the computing device uses computing resources to provide services, the ability of the computing device to provide services is limited based on the number and/or quantity of hardware components that may be disposed within the chassis. For example, by adding additional processors, memory modules, special purpose hardware devices, expansion cards that include any number and type of hardware components, etc., the computing device housed in the chassis may be provided with additional computing resources (e.g., processor cycles, memory bandwidth, storage volume, communications bandwidth, etc.) which it may use to provide computer implemented services.

In general, embodiments of the invention provide methods, devices, and systems for managing components that provide computing resources. Specifically, embodiments of the invention may provide a chassis that includes an expansion card receiver (120). The expansion card receiver (120) may be a physical device for receiving one or more expansion card (130). Once received, the expansion card receiver (120) may position, orient, provide power to, thermally manage, and/or otherwise manage the expansion cards (e.g., 120) disposed in the expansion card receiver.

In one or more embodiments of the invention, the expansion card receiver is adapted to tightly pack expansion cards within the internal volume of the chassis. Because the internal volume of the chassis is limited, increasing the packing density of hardware components such as expansion cards within the internal volume may improve the quantity of computing resources made available to the computing device. However, by doing so, it may become difficult to physically insert and/or remove expansion card receivers to/from a chassis. For example, by increasing the density of components within the chassis, it may become impractical to grasp at the sides of an expansion card receiver to physical manipulate is location within the chassis. As will be discussed in greater detail below, embodiments of the invention may provide an expansion card receiver that may be manipulated without grasping at the sides of it, be partially obscured, or require accessing difficult to reach portions.

An expansion card (e.g., 130) may be a component that provides computing resources to the computing device at least partially disposed within the chassis. For example, an expansion card (130) may be a device designed to operably connect to a computing device using a Peripheral Component Interconnect (PCI) slot (or other type of standards based or custom form factor). The expansion card receiver (120) may include any number of PCI slots or other types of mechanical and/or electrically operable connectors for connecting expansion cards. In turn, the aforementioned connector of the expansion card receiver may be operably connected to other components thereby enabling the expansion cards disposed within an expansion card receiver to be operably connected to other components (e.g., other components of a computing device such as processors, memory, storage, communication bridges, etc.). The operably connection may enable the aforementioned devices to exchange digital information with each other.

The expansion card (130) may include, for example, a circuit card upon which any number of hardware components is disposed. The circuit card may operably connect the hardware components to the computing device (or other component to which the expansion card receiver is operably connected) via a PCI slot in which the expansion card (130) may be disposed.

To connect to the PCI slot, the expansion card (130) may include an edge connector or another type of connector designed to physically and/or electrically connect to the PCI slot (or another type of expansion card receiver included on an expansion card receiver). When so connected, the wiring on the circuit card of the expansion card (130) may operably connect the components of the expansion card (130) to any number of other components that are operably connected to the expansion card receiver.

However, as noted above, inserting or removing the expansion card receiver (120) may be problematic. For example, the location in a chassis in which an expansion card receiver (120) is to be placed may be densely packed with other components. Consequently, it may be difficult to grip or otherwise manipulate the sides or bottom of the expansion card receiver (120). Further, when the expansion card receiver (120) is disposed in a chassis, it may not be possible to insert or remove expansion cards. For example, expansion cards may have form factors (e.g., shapes/sizes) that limit how they may be oriented within a chassis. Consequently, it may be necessary to insert and/or remove expansion cards from a side of the expansion card receiver (120) that is blocked by other components when the expansion card receiver is disposed in the chassis.

An expansion card receiver (120) in accordance with embodiments of the invention may include a mechanism for enabling it to be physically manipulated while disposed within the chassis. The mechanism may be operable from a top side (or other side that coincides with a removable portion of the chassis) thereby reducing the likelihood that the side from which the mechanism may be operated is physically blocked by other components. Consequently, an expansion card receiver in accordance with embodiments of the invention may reduce the likelihood of the expansion card receiver, expansion card disposed within the expansion card receiver, other components disposed within the chassis, and/or users tasked with inserting/removing expansion card receivers from being damaged when inserting/removing an expansion card receiver into/from a chassis.

In addition to the expansion card receiver (120) and expansion card (130), any number of other components (102) may be disposed in the chassis (100A). The other components (102) may include thermal management components such as fans, computing components such as processors, etc.

To further clarify aspects of embodiments of the invention, a diagram of an expansion card (130) in accordance with embodiments of the invention is provided in FIG. 1.3 and diagrams of an expansion card receiver in accordance with one or more embodiments of the invention are provided in FIGS. 2.1-2.4.

Turning to FIG. 1.3, FIG. 1.3 shows a diagram an expansion card (130) in accordance with one or more embodiments of the invention. An expansion card may be a physical device that provides computing resources to a computing device. For example, an expansion card may be implemented to provide special functions (e.g., implement as graphics processing units, co-processors, storage devices, etc.) or general purpose functions.

To provide its functionality, the expansion card (130) may include a circuit card (140). Hardware components (e.g., 150) may be disposed on the circuit card. Any number and type of hardware components may be disposed on the circuit card. The hardware components may include, for example, computer chips, resistors, capacitors, inductors, transformers, fuses, light emitting diodes, and/or other types of physical devices.

To enable other components to communicate with the hardware components (150), the expansion card (130) may include an electrical connector (170). The electrical connector (170) may comply with any format. For example, the electrical connector (170) may be a PCI compliant connector such as an edge connector.

The electrical connector and hardware components may be operably connected to each other via circuitry (160). The circuitry may enable the hardware components (150) to electrically interact with each other and/or other components that may be connected through the electrical connector (170).

While illustrated as including a limited number of specific components, an expansion card in accordance with embodiments of the invention may include additional, different, and/or fewer components without departing from the invention.

Turning to FIG. 2.1, FIG. 2.1 shows a diagram of an expansion card receiver (200) in accordance with one or more embodiments of the invention. As discussed above, the expansion card receiver (200) may be adapted to receive expansion cards and operably connect them to other components while received by the expansion card receiver.

When received by the expansion card receiver (200), an expansion card may be operably connected to other components of, for example, a computing device to which the expansion card receiver (200) is operably connector. Additionally, the expansion card receiver (200) may position and/or orient any number of expansion cards with respect to one another within the expansion card receiver (200). By positioning and/or orienting the expansion cards, the number of components within a chassis may be increased by improving the packing density of components within the chassis.

To receive expansion cards, the expansion card receiver may include a receiving portion (210). The receiving portion may be adapted to receive expansion cards and mechanically, thermally, and/or electrically manage expansion cards that have been received. By doing so, multiple expansion cards may be disposed within the receiving portion (210).

However, by improving the packing density of components within a chassis, the expansion card receiver (200) may be disposed in locations within a chassis that make it less accessible. For example, other expansion card receivers or components of a computing device may be disposed directly adjacent or near sides of the expansion card receiver (e.g., the sides being the left, right, front, and back surfaces of the expansion with respect to FIG. 2.1). Thus, it may be difficult to grip or otherwise manipulate the sides of the expansion card receiver (200) to physically move it. Further, the structure of the expansion card receiver (200) may prevent access to mechanisms disposed on the bottom of the expansion card receiver (200) that may physically attach it to the chassis or other structures.

To address the above and/or other concerns, the expansion card receiver (200) may include a management portion (205). The management portion (205) of the expansion card receiver (200) may be adapted to enable the expansion card receiver (200) to reversibly transition from a (i) first state in which it is fixedly attached to another structure and does not provide for easy physical manipulation to a (ii) second state in which it is detached from the other structure and provides for easy physical manipulation. The management portion (205) may facilitate reversible transition between these states using portions of the management portion (205) that are easily accessible from the top of the expansion card receiver (200). Consequently, the aforementioned features may be easily utilized even when the expansion card receiver (200) is disposed or to be disposed next to other components that may limit physical access to all, or a portion, of the sides and/or bottom of the expansion card receiver (200). To provide the aforementioned reversible state transition, the management portion (205) may include an actuator (220) and a handle aperture (230).

The actuator (220) may be implemented as, for example, a button, toggle switch, slider, or another type of physical mechanism that may be manipulated by a person. When manipulated by a person (e.g., when a button is pressed), an internal mechanism of the management portion (205) illustrated in FIGS. 2.3-2.4 may (i) release a handle under tension that is adapted to extent out of the handle aperture (230) and (ii) disengage the expansion card receiver (200) from a structure on which it is disposed. For additional details regarding the internal mechanism included in the management portion (205), refer to FIGS. 2.3-2.4.

Turning to FIG. 2.2, FIG. 2.2 shows a diagram of the expansion card receiver (200) after the internal mechanism within the management portion (205) has been triggered. As seen in FIG. 2.2, triggering the internal mechanism has caused the expansion card receiver (200) to transition to the second state. In the second state, a handle (240) has been extended out of the handle aperture (230) thereby enabling a person to easily grip a portion of the expansion card receiver (200). By enabling the expansion card receiver (200) to be easily gripped, the expansion card receiver (200) may be moved, reoriented, and/or otherwise manipulated in a manner that is less likely to result in damage to the expansion card receiver (200), expansion cards disposed within the expansion card receiver (200), other components disposed within a chassis, and/or the person (e.g., due to getting, for example, appendages caught between the expansion card receiver (200) and other components).

While not illustrated in FIG. 2.2, transitioning the expansion card receiver (200) to the second state may also detach the expansion card receiver (200) from another structure upon which the expansion card is disposed. As will be discussed with respect to FIGS. 2.3-2.4, a chassis, circuit board, or other structure on which the expansion card receiver (200) may be disposed may include hooks, loops, or other structures to which the expansion card receiver (200) may reversibly attach for mechanical stability purposes.

As seen in FIG. 2.2, the receiving portion (210) of the expansion card receiver (200) may include a receiving portion aperture (212) through which expansion cards may be placed within the internal volume of the receiving portion (210). Due to the shape, size, or other characteristics of the expansion cards and chassis, the expansion cards may need to be oriented in a manner that necessitates inserting them into the receiving portion (210) through a side (rather than the top or bottom) thereby preventing expansion cards from being inserted into or removed from the expansion card receiver (200) when the expansion card receiver (200) is disposed in a chassis. For example, other components disposed in the chassis may block access to the receiving portion aperture (212). Consequently, it may be necessary to remove the expansion card receiver (200) to insert expansion cards into or remove expansion cards from the receiving portion (210) of the expansion card receiver (200).

Turning to FIGS. 2.3-2.4, these figures illustrate internal view of the management portion (205) taken along the plane marked as I-II in FIG. 2.1. Specifically, FIG. 2.3 shows a diagram of the internal mechanism of the management portion (205) while the expansion card receiver (200) is in the first state. In contrast, FIG. 2.4 shows a diagram of the internal mechanism of the management portion (205) while the expansion card receiver (200) is in the second state. In FIGS. 2.3-2.4, medium dashed lines (e.g., left and right hand sides of the figures) are included to indicate that the structures shown may continue past the dashed lines.

Turning to FIG. 2.3, FIG. 2.3 shows a diagram of the internal mechanism of the management portion (205) while the expansion card receiver (200) is in the first state in accordance with one or more embodiments of the invention. As discussed above, when in the first state, the management portion may (i) fixedly attach the expansion card receiver to another structure and/or (ii) dispose the handle (240) within the management portion thereby minimizing the volume of the expansion card receiver.

To provide the above functionality, the management portion (205) may include a rotational mount (235). The rotational mount (235) may be a structure adapted to rotate about a pivot (237). For example, the rotational mount (235) may be implemented as a generally circular structure having a predetermined thickness. The circular structure may be constructed from metal, plastic, or another suitable structural material.

The rotational mount (235) may be under tension when in the first state by virtue of spring loading (or other tensioning mechanism) of the pivot (237), which applies clockwise directed rotational pressure (e.g., illustrated via the arrow with the short dashed tail) to the rotational mount (235).

While in the first state, a rotational mount latch release (224) may be disposed at a location that prevents the rotational mount (235) from rotating in response to the pressure applied by the pivot (237). The rotational mount latch release (224) may be a physical structure that is adapted to create an interference with a rotational mount latch (239) of the rotational mount (235) that prevents the rotational mount (235) from rotating in response to the pressure applied by the pivot (237).

The rotational mount latch release (224) may be disposed on a sliding mount (e.g., 222) that enables it to release the interference between it and the rotational mount latch (239) thereby enabling the rotational mount (235) to rotate in response to the pressure applied by the pivot (237).

The rotational mount latch release (224) may be moved by the actuator (220). For example, the actuator (220) may be disposed on a sliding mount that enables the actuator (220) to interact with the rotational mount latch release (224) when pressure is applied to a control surface (226) of the actuator (220).

For example, when pressure is applied to the control surface (226), the actuator (220) may move towards the rotational mount latch release (224). When the actuator (220) contacts the rotational mount latch release (224), the rotational mount latch release (224) may move thereby releasing the interference between it and the rotational mount latch (239).

Both the actuator (220) and rotational mount latch release (224) may include a return mechanism (e.g., spring loaded) that preferentially returns these components to the aforementioned locations once the pressure on the control surface (226) has been removed.

As seen in FIG. 2.3, the handle (240) may be disposed on the rotational mount (235) thereby causing the handle (240) to extend out of the management portion (205) through the handle aperture (230) when the rotational mount (235) rotates in response to the interference between the rotational mount latch (239) and rotational mount latch release (224) being released.

Additionally, as seen in FIG. 2.3, a chassis latch (250) may be disposed on the rotational mount (235). The chassis latch (250) may be a physical structure adapted to attach the expansion card receiver to a chassis portion (252). For example, a chassis may include a hook, loop, or other structure that, when the expansion card receiver is disposed in the chassis, is disposed within the management portion or adjacent to the management portion. The chassis latch (250) may include complementary structures that, while the expansion card is in the first state, physically attach to the chassis portion (252).

The chassis latch (250) may be further adapted to release the chassis portion (252) when the expansion card receiver is in the second state. For example, as will be seen in FIG. 2.4, the chassis latch (250) may detach from the chassis portion (252) when the rotational mount (235) rotates after the interference between the rotational mount latch (239) and the rotational mount latch release (224) is released.

While the handle (240), rotational mount (235), rotational mount latch (239), and chassis latch (250) are illustrated as a unitary structure in FIG. 2.3, the aforementioned structure may be divided into any number of separate structures and may be assembled to obtain the aforementioned structure. Generally, any of these components may be formed from, in part, flat stock milled into the corresponding shapes of each of these components. These components may be formed from any suitable material including, for example, metals, ceramics, plastics, composites thereof, etc.

The actuator (220) may be formed from any suitable material including, for example, metals, ceramics, plastics, composites thereof, etc. For example, the actuator (220) may be formed from a metal coated or painted plastic material.

The rotational mount latch release (224) may be formed from any suitable material including, for example, metals, ceramics, plastics, composites thereof, etc. For example, the rotational mount latch release (224) may be formed from a metal and/or plastic material.

The sliding mounts (222) may be implemented as, for example, slots in a sheet of material. The actuator (220) and rotational mount latch release (224) may move along the sliding mounts (222) by including pegs, bolts, or other structures that couple these components to the sliding mounts (222). While not illustrated in FIG. 2.3, both sliding mounts (222) may include a return mechanism such as, for example, a spring or other structure that tends to move the rotational mount latch release (224) into a position where it creates an interference with the rotational mount latch (239). Similarly, the return mechanism associated with the actuator (220) may preferentially move the control surface (226) towards an open portion of the top of the management portion (205) and away from the rotational mount latch release (224) thereby enabling the rotational mount latch release (224) to return to its position in which it creates an interference with the rotational mount latch (239).

The pivot (237) may be implemented using any suitable structure including, for example, bolts, rotational bearings, etc. The pivot (237) may include a return mechanism that attempt to cause it and the rotational mount (235) to rotate clockwise with respect to FIG. 2.3. However, the direction of rotation may be reversed should the handle (240) and/or other components disposed on the rotational mount (235) be oriented in different manners.

Turning to FIG. 2.4, FIG. 2.4 shows a diagram of the internal mechanism of the management portion (205) while the expansion card receiver (200) is in the second state in accordance with one or more embodiments of the invention. As discussed above, when in the second state, the management portion may (i) detach the expansion card receiver from another structure and/or (ii) dispose the handle (240) outside the management portion thereby enabling a person to grip or otherwise physically interact with the handle (240).

As seen in FIG. 2.4, when pressure is applied by a pressure applicator (260) (e.g., a finger) to the control surface of the actuator (220), the actuator (220) interacts with the rotational mount latch release (224). The interaction causes the rotational mount latch release (224) to move away from the rotational mount latch (239) thereby releasing the interference between these two components.

When the interference is released, the rotational mount (235) rotates clockwise which, in turn, causes the handle (240) and chassis latch (250) to move. Specifically, the handle (240) is extended outside of the management portion (205) thereby enabling a person to grip or otherwise physically interact with it. By virtue of the attachment of the handle (240) to the expansion card receiver, the person may physically move the expansion card receiver with ease.

Additionally, the chassis latch (250) is moved away from the chassis portion (252) thereby detaching the expansion card receiver from the chassis or other structure on which the expansion card receiver is disposed. The aforementioned detachment may occur between a portion of the expansion card receiver and chassis that is entirely obscured from the view of a person. Consequently, the person may need not have physical access to this portion of the expansion card receiver to facilitate detachment.

After being placed into the second state, the expansion card receiver may be returned to the first state by (i) removing the pressure applied to the actuator and (ii) rotating the handle (240) back into the internal volume of the management portion (205). Because the handle (240) is held in place by the return mechanism which applies a limited amount of force, force applied by a person in a counter-clockwise direction may overcome the force applied by the return mechanism thereby enabling the expansion card receiver to return to the first state.

By doing so, the rotational mount latch release (224) and rotational mount latch (239) may be returned to positions in which an interference between them is formed. Additionally, the return mechanism of the pivot may be re-tensioned thereby readying the mechanism for future use. Lastly, the actuator (220) may return to its previous position as illustrated in FIG. 2.3 by virtue of its corresponding return mechanism.

To further clarify aspects of embodiments of the invention, FIGS. 3.1-3.4 show an example use of an expansion card receiver in accordance with one or more embodiments of the invention.

FIG. 3.1 shows a diagram of an example chassis (300) in accordance with one or more embodiments of the invention. The example chassis (300) includes an example expansion card receiver (310). As seen from FIG. 3.1, the example expansion card receiver (310) is surrounded by other components and/or walls of the chassis. Consequently, removal of the example expansion card receiver (310) in this configuration would be difficult and/or potential result in damage if the mechanisms provided by the example expansion card receiver (310) for its removal are not employed.

For example, it may be very difficult for a person to grasp or other manipulate the example expansion card receiver (310) in a manner that does not result it being pressed against other objects if the removal mechanisms of the example expansion card receiver (310) are not employed. Further, the bottom of the example expansion card receiver (310) may not be physically accessible. Consequently, it may be difficult to detach the example expansion card receiver (310) from the example chassis (300) if the mechanisms provided for detachment by the example expansion card receiver (310) are not utilized.

At a first point in time, an expansion card housed in the example expansion card receiver (310) fails. A person is tasked with replacing the failed expansion card. However, as seen in FIG. 3.1, the expansion cards disposed in the example expansion card receiver (310) are not accessible due to the placement of other components adjacent to the example expansion card receiver (310).

Prior to the state of the example chassis (300) illustrated in FIG. 3.1, the example chassis (300) may be disposed in an enclosure. The person may remove (partially or totally) the example chassis (300) from the enclosure and may remove a top cover of the example chassis (300) to place the example chassis (300) in the state illustrated in FIG. 3.1.

Turning to FIG. 3.2, FIG. 3.2 shows a second diagram of the example chassis (300) in accordance with one or more embodiments of the invention. In FIG. 3.2, the person has applied pressure to the actuator (320) resulting in the example expansion card receiver (310) transitioning from the first state to the second state. Consequently, in FIG. 3.2, the handle (330) of the example expansion card receiver (310) has been extended outside of the example expansion card receiver (310) enabling a user to easily, physically manipulate the example expansion card receiver (310) by applying force (e.g., gripping and moving) to the handle (330).

Turning to FIG. 3.3, FIG. 3.3 shows a third diagram of the example chassis (300) in accordance with one or more embodiments of the invention. In FIG. 3.3, the person has applied pressure (as indicated by the large arrow) to the handle (330) by grasping and pulling the handle (330) out of the example chassis (300). Because the example expansion card receiver (310) is in the second state, it is detached from the example chassis (300) able to be removed from the example chassis (300) with little force from the user. Additionally, due to the high degree of physical accessibility of the handle (330) by virtue of it being extended outside of the example expansion card receiver (310), the person was able to apply appropriately directed force so that the example expansion card receiver (310) did not bump in to other components disposed in the example chassis (300) or otherwise move in manners that may subject it and/or other components and/or the person to physical damage.

Additionally, as seen in FIG. 3.3, by removing the example expansion card receiver (310) from the example chassis (300), the failed expansion card (340) has been exposed to the person through an open side of the example expansion card receiver (310).

Turning to FIG. 3.4, FIG. 3.4 shows a fourth diagram of the example chassis (300) in accordance with one or more embodiments of the invention. In FIG. 3.4, the person has applied pressure (as indicated by the large arrow) to the failed expansion card (340) by grasping and pulling the failed expansion card (340) using the exposure provided by removal of the example expansion card receiver (310) from the example chassis (300).

Once removed, a new expansion card may be placed into the example expansion card receiver (310) and the example expansion card receiver (310) may be returned to the example chassis (300) thereby completing replacement of the failed expansion card (340).

Figure 5:
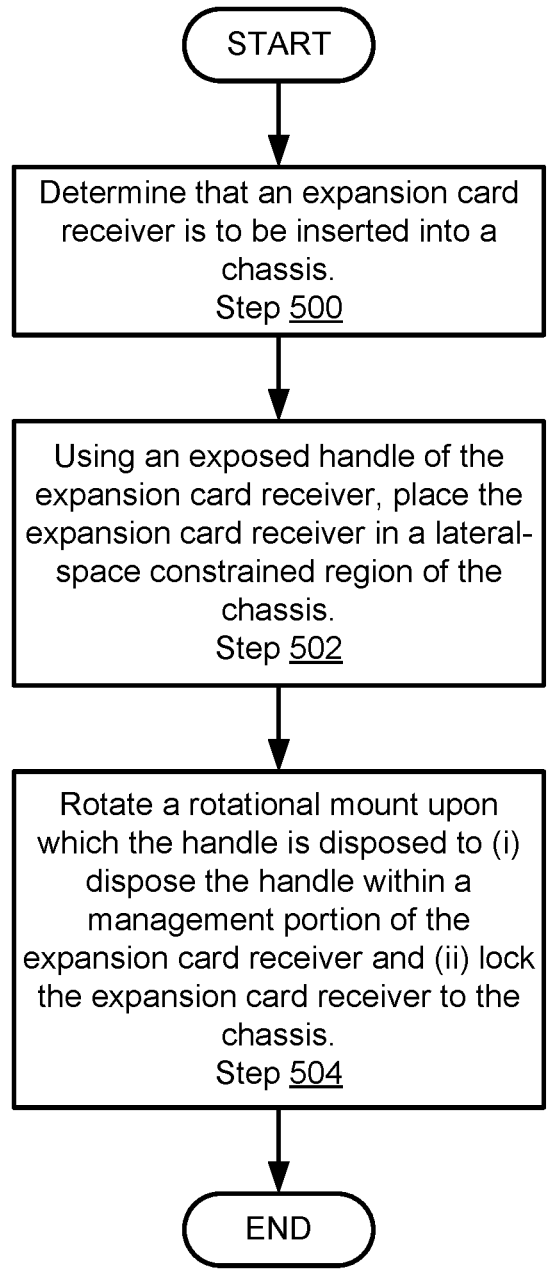
FIG. 5 shows a flowchart of a method of inserting an expansion card receiver into a chassis in accordance with one or more embodiments of the invention.

Returning to FIG. 2.1, an expansion card receiver (200) may be used to manage expansion cards. To do so, the expansion card receiver (200) may be removed from and/or inserted into a chassis. FIGS. 4-5 illustrate methods that may be used to remove and/or insert chassis.

FIG. 4 shows a method that may be performed to remove an expansion card receiver from a chassis. While FIG. 4 is illustrated as a flowchart including a number of steps, methods in accordance with embodiments of the invention may include additional, fewer, and/or different steps without departing from the invention. Additionally, while the steps illustrated in FIG. 4 are illustrated in a particular order, the steps may be performed in a different order, any number of steps may be omitted, any number of steps may be repeated, and/or any number of steps may be performed in a parallel or partially overlapping manner without departing from the invention. The method shown in FIG. 5 may be performed using, for example, an expansion card receiver (e.g., 200, FIG. 2.1).

In step 400, it is determined that an expansion card is to be removed from a chassis. The determination may be made, for example, based on an indication provided by a computing device disposed in a chassis. The chassis may include an expansion card receiver in which the expansion card is disposed.

For example, when an expansion card fails, enters an error state, or becomes otherwise inoperable, it may be necessary to remove the expansion card. By removing the expansion card, the expansion card may be tested, the expansion card receiver may be tested, the computing device operably connected to the expansion card may be tested, and/or other diagnostic testing be performed. Similarly, by removing the expansion card, a different expansion card having similar capabilities and/or features may be replaced in the expansion card receiver thereby enabling the computing device which the expansion card receiver is operably connected to continue to use the functionality of the newly replaced expansion card. Further, an expansion card may be removed and replaced by a different expansion card to provide a computing device with other capabilities than that provided by the now-replaced expansion card.

In step 402, force is applied to an actuator on the expansion card receiver to (i) obtain access to a handle and (ii) decouple the expansion card receiver from the chassis. By applying force to the actuator, the expansion card receiver may be transition from a first state in which the handle is hidden inside the expansion card receiver and the expansion card is fixedly attached to the chassis to a second state in which the handle is exposed (e.g., disposed, at least in part, outside of the expansion card receiver) and the expansion card receiver is detached from the chassis.

The state transition may be initiated by actuation of the actuator by virtue of the force applied to the actuator. For example, the actuator may be physically coupled to an internal mechanism of the expansion card receiver that causes the expansion card receiver to transition between states.

In step 404, the expansion card receiver is moved using the handle to expose the expansion card. For example, a person may grasp or otherwise manipulate the handle in a manner that moves the expansion card receiver outside of the chassis. By doing so, a side of the expansion card receiver through which the expansion card may be accessed may be exposed. Prior to moving the expansion card receiver, other components within the chassis may prevent access to the side of the expansion card receiver through which the expansion card may be accessed.

In step 406, the exposed expansion card is removed. The exposed expansion card may be removed by applying force (e.g., grasping) to the expansion card that causes the expansion card to move out of the expansion card receiver through the side of the expansion card receiver through which the expansion card receiver may be accessed.

The method may end following step 406.

FIG. 5 shows a method that may be performed to insert an expansion card receiver into a chassis. While FIG. 5 is illustrated as a flowchart including a number of steps, methods in accordance with embodiments of the invention may include additional, fewer, and/or different steps without departing from the invention. Additionally, while the steps illustrated in FIG. 5 are illustrated in a particular order, the steps may be performed in a different order, any number of steps may be omitted, any number of steps may be repeated, and/or any number of steps may be performed in a parallel or partially overlapping manner without departing from the invention. The method shown in FIG. 5 may be performed using, for example, an expansion card receiver (e.g., 200, FIG. 2.1).

In step 500, it is determined that an expansion card is to be inserted into a chassis. The determination may be made, for example, completion of the method illustrated in FIG. 4.

For example, after a new expansion card is placed into an expansion card receiver, the expansion card receiver may need to be placed back into the chassis for the expansion card (and/or other expansion cards disposed in the expansion card receiver) to provide its functionality.

In step 502, an exposed handle of the expansion card receiver is used to place the expansion card receiver in a lateral-area space constrained region of the chassis. The region may be space constrained by virtue of other components disposed adjacent to the region.

The exposed handle may facilitate precision placement of the expansion card receiver in the region by virtue of it being exposed. The handle may not need to traverse near other components disposed in the chassis for the expansion card receiver to be placed in the region. Consequently, use of the handle may reduce the likelihood of the expansion card or other entities from being damaged during placement in the region.

In step 504, a rotational mount upon which the handle is disposed is rotated to (i) dispose the handle within a management portion of the expansion card receiver and (ii) lock the expansion card receiver to the chassis. As discussed above, the handle may be attached to the rotational mount.

Consequently, rotating the rotational mount may cause the handle to retract within the management portion of the expansion card receiver.

Similarly, rotating the rotational mount may cause a chassis latch attached to the rotational mount to create an interference with a portion of the chassis thereby attaching the expansion card receiver to the chassis.

By rotating the rotational mount, the chassis may be returned to the first state in which the handle is disposed within the expansion card receiver and the expansion card receiver is attached to the chassis.

The method may end following step 504.

Using the methods illustrated in FIGS. 4-5, embodiments of the invention may provide methods for inserting and/or remove expansion cards into/from chassis in a manner that reduces the chance of damage occurring.

Figure 6:
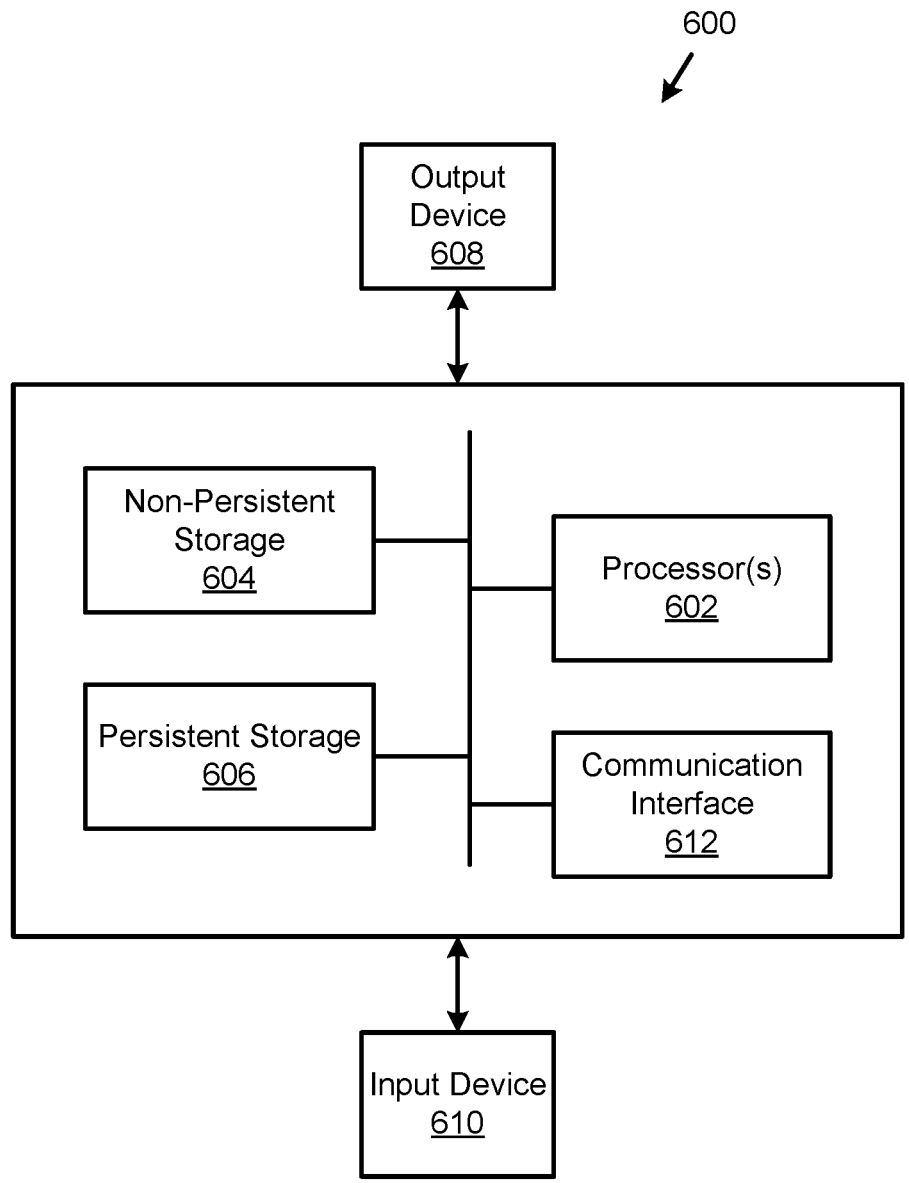
FIG. 6 shows a diagram of a computing device in accordance with one or more embodiments of the invention.

As discussed above, embodiments of the invention may be implemented using a computing device. FIG. 6 shows a diagram of a computing device in accordance with one or more embodiments of the invention. The computing device (600) may include one or more computer processors (602), non-persistent storage (604) (e.g., volatile memory, such as random access memory (RAM), cache memory), persistent storage (606) (e.g., a hard disk, an optical drive such as a compact disk (CD) drive or digital versatile disk (DVD) drive, a flash memory, etc.), a communication interface (612) (e.g., Bluetooth interface, infrared interface, network interface, optical interface, etc.), input devices (610), output devices (608), and numerous other elements (not shown) and functionalities. Each of these components is described below.

In one embodiment of the invention, the computer processor(s) (602) may be an integrated circuit for processing instructions. For example, the computer processor(s) may be one or more cores or micro-cores of a processor. The computing device (600) may also include one or more input devices (610), such as a touchscreen, keyboard, mouse, microphone, touchpad, electronic pen, or any other type of input device. Further, the communication interface (612) may include an integrated circuit for connecting the computing device (600) to a network (not shown) (e.g., a local area network (LAN), a wide area network (WAN) such as the Internet, mobile network, or any other type of network) and/or to another device, such as another computing device.

In one embodiment of the invention, the computing device (600) may include one or more output devices (608), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (602), non-persistent storage (604), and persistent storage (606). Many different types of computing devices exist, and the aforementioned input and output device(s) may take other forms.

Embodiments of the invention may provide an improved method for managing components of an information handling system. Specifically, embodiments of the invention may provide a method, system, and device for facilitating removal and insertion of expansion cards in a manner that is less likely to result in damage to the expansion card and/or expansion card holder. To do so, embodiments of the invention may provide an expansion card receiver that includes a retractable handle. The retractable handle may be accessible using a portion of the expansion card receiver that is unlikely to be obscured or otherwise rendered inaccessible by other components disposed in a chassis. Consequently, the handle may be used to precisely manipulate the physical location of the expansion card receiver while also enabling it to be hidden to improve the packing density of components disposed within a chassis.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A chassis for housing a computing device of an information handling system, comprising:
   a receiving portion of an expansion card receiver adapted to:
      receive an expansion card, and
      operably connect the expansion card to another component of the computing device while the expansion card is received by the receiving portion; and
   a management portion of the expansion card receiver, wherein the management portion is adapted to:
      receive a force from a user;
      in response to receiving the force:
         transition the management portion from a first state to a second state,
      wherein when the management portion is in the first state:
         a handle, adapted to enable the expansion card to be removed from the chassis, is disposed completely inside of the management portion in a first position,
         wherein the handle is orthogonal to the expansion card when the expansion card is received in the receiving portion,
         the expansion card receiver is locked to the chassis using a chassis latch,
      wherein when the management portion is in the second state:
         the handle is disposed outside of the management portion in a second position that enables the user to utilize the handle,
         the expansion card receiver is unlocked from the chassis,
      wherein the management portion comprises:
         an actuator comprising a control surface disposed on an exterior surface of the expansion card receiver,
         a rotational mount upon which the handle and the chassis latch are disposed, and
         a rotational mount latch release,
      wherein the actuator is mechanically coupled to the rotational mount by the rotational mount latch release,
      wherein the force comprises of pressure applied to the control surface of the actuator, which causes the rotational mount latch release to release rotational tension applied to the rotation mount when the force is received using the control surface, wherein the rotational mount is adapted to rotate about a pivot when the rotational tension is released, wherein the pivot is located in the center of the rotational mount; and wherein when the rotational mount rotates about the pivot, the handle rotates about the pivot from the first position to the second position.

2. The chassis of claim 1, wherein the management portion of the expansion card is further adapted to:
   receive a second force from the user;
   in response to receiving the second force:
      transition the management portion from the second state to the first state.

3. The chassis of claim 2, wherein the second force is received using the handle.

4. The chassis of claim 1, wherein the handle is adapted to extend outside of the management portion when the rotational mount rotates in response to the rotational tension being released.

5. The chassis of claim 1, wherein the receiving portion of the expansion card receiver is adapted to receive a plurality of expansion cards, and operably connect each of the plurality of expansion cards to another component of the computing device while each of the plurality of expansion cards is received by the receiving portion.

6. An expansion card receiver, comprising:
   a receiving portion adapted to:
      receive an expansion card, and
      operably connect the expansion card to another component of a computing device while the expansion card is received by the receiving portion; and
   a management portion adapted to:
      receive a force from a user;
      in response to receiving the force:
         transition the management portion from a first state to a second state,
   wherein when the management portion is in the first state:
      a handle, adapted to enable the expansion card to be removed from the computing device, is disposed completely inside of the management portion in a first position, wherein the handle is orthogonal to the expansion card when the expansion card is received in the receiving portion,
      the expansion card receiver is locked to a chassis using a chassis latch, wherein the computing device is disposed within a chassis,
   wherein when the management portion is in the second state:
      the handle is disposed outside of the management portion in a second position that enables the user to utilize the handle,
      the expansion card receiver is unlocked from the computing device,
   wherein the management portion comprises:
      an actuator comprising a control surface disposed on an exterior surface of the expansion card receiver,
      a rotational mount upon which the handle and the chassis latch are disposed, and
      a rotational mount latch release,
   wherein the actuator is mechanically coupled to the rotational mount by the rotational mount latch release,
   wherein the force comprises of pressure applied to the control surface of the actuator, which causes the rotational mount latch release to release rotational tension applied to the rotation mount when the force is received using the control surface,
   wherein the rotational mount is adapted to rotate about a pivot when the rotational tension is released, wherein the pivot is located in the center of the rotational mount, and
   wherein when the rotational mount rotates about the pivot, the handle rotates about the pivot from the first position to the second position.

7. The expansion card receiver of claim 6, wherein the management portion of the expansion card is further adapted to:
   receive a second force from the user;
   in response to receiving the second force:
      transition the management portion from the second state to the first state.

8. The expansion card receiver of claim 7, wherein the second force is received using the handle.

9. The expansion card receiver of claim 6, wherein the handle is adapted to extend outside of the management portion when the rotational mount rotates in response to the rotational tension being released.

10. The expansion card receiver of claim 6, wherein the receiving portion of the expansion card receiver is adapted to receive a plurality of expansion cards, and operably connect each of the plurality of expansion cards to another component of the computing device while each of the plurality of expansion cards is received by the receiving portion.

* * * * *